United States Patent [19]
Colgan et al.

[11] Patent Number: 5,925,933
[45] Date of Patent: *Jul. 20, 1999

[54] INTERCONNECT STRUCTURE USING AL$_2$-CU FOR AN INTEGRATED CIRCUIT CHIP

[75] Inventors: Evan George Colgan, Suffern; Kenneth Parker Rodbell, Poughguag; Paul Anthony Totta, Poughkeepsie; James Francis White, Newburgh, all of N.Y.

[73] Assignee: International Business Machines Corporation, Armonk, N.Y.

[ * ] Notice: This patent is subject to a terminal disclaimer.

[21] Appl. No.: 08/729,561

[22] Filed: Oct. 11, 1996

Related U.S. Application Data

[62] Division of application No. 08/332,328, Oct. 31, 1994, Pat. No. 5,565,707.

[51] Int. Cl.$^6$ ............ H01L 23/48; H01L 23/52; H01L 29/40
[52] U.S. Cl. ............ 257/762; 257/750; 257/758; 257/767; 257/771
[58] Field of Search .................. 257/762, 750, 257/758, 763, 764, 767, 765, 751, 771; 438/755, 756, 757, 761, 622

[56] References Cited

U.S. PATENT DOCUMENTS

| | | | |
|---|---|---|---|
| 4,307,179 | 12/1981 | Chang et al. | 430/314 |
| 4,335,506 | 6/1982 | Chiu et al. | 29/591 |
| 4,884,123 | 11/1989 | Dixit et al. | 357/71 |
| 5,010,039 | 4/1991 | Ku et al. | 437/228 |
| 5,071,714 | 12/1991 | Rodbell et al. | 428/620 |
| 5,110,759 | 5/1992 | Ryoichi Mukai | 437/173 |
| 5,130,274 | 7/1992 | Harper et al. | 437/195 |
| 5,171,642 | 12/1992 | DeHaven et al. | 428/620 |
| 5,243,221 | 9/1993 | Ryan et al. | 257/762 |
| 5,300,307 | 4/1994 | Frear et al. | 427/96 |
| 5,455,195 | 10/1995 | Ramsey et al. | 257/780 |
| 5,565,707 | 10/1996 | Colgan et al. | 257/762 |

FOREIGN PATENT DOCUMENTS

| | | |
|---|---|---|
| A-0 045 405 | 7/1981 | European Pat. Off. . |
| A-0 395 560 | 3/1990 | European Pat. Off. . |
| A-2 143 709 | 6/1972 | France . |
| A-04 111317 | 4/1992 | Japan . |

OTHER PUBLICATIONS

B. Luther et al., Proc. IEEE, VLSI Multilevel Interconnections Conf., Santa Clara, CA, Jun. 8–9, 1993, pp. 15–21.
Anonymous, "L1 and V1 Stud Metal Rework Procedure", Research Disclosure 31758; Sep. 1990.
J. Havas et al., "Self–Aligning Metal Land and Feed–Through Structure", IBM TDB, vol. 27, No. 7B, Dec. 1984, pp. 4159–4160.
A. Nagy et al., "Planarized Inorganic Interlevel Dielectric for Multilevel Metallization –Part I", Solid State Technology, vol. 34, No. 1, pp. 53–56, Jan. 1991.

*Primary Examiner*—Mahshid Saadat
*Assistant Examiner*—Jhihan B. Clark
*Attorney, Agent, or Firm*—Robert M. Trepp

[57] ABSTRACT

An interconnect structure and method for an integrated circuit chip for resisting electromigration is described incorporating patterned interconnect layers of Al or Al—Cu and interlayer contact regions or studs of Al$_2$Cu between patterned interconnect layers. The invention overcomes the problem of electromigration at high current density in the interconnect structure by providing a continuous path for Cu and/or Al atoms to move in the interconnect structure.

10 Claims, 4 Drawing Sheets

5,925,933

INTERCONNECT STRUCTURE USING AL$_2$-CU FOR AN INTEGRATED CIRCUIT CHIP

This application is a division of application Ser. No. 08/332,328 filed on Oct. 31, 1994 now U.S. Pat. No. 5,565,707.

FIELD OF THE INVENTION

This invention relates to multilevel metal interconnections on an integrated circuit chip and more particularly to vias, studs, or riser wires between conductors of respective levels of metal interconnections with reduced electromigration failures.

BACKGROUND OF THE INVENTION

The current metalization used in multilevel metal interconnections by some manufacturers include aluminum-copper lines for each level of metalization and tungsten vias or studs between conductors of respective levels of metal interconnections. The use of Cu solute additions to Al is desirable because it reduces the rate of electromigration and stress-voiding. The amount of Cu addition Al, however, is limited by the ability to reactive ion etch the Al(Cu) line to $\leq 2$ wt. %Cu. The tungsten studs act as a complete barrier to copper and aluminum atoms which may be moved or transported at high current densities in the conductors, resulting in copper and/or aluminum depletion adjacent to tungsten studs which, in turn leads to electromigration open failures. To avoid electromigration open failures, a set of downstream ground rules for electrical current is required to limit the current densities in the conductors. The ground rules, however, limit the performance of advanced complementary metal oxide semiconductor (CMOS) logic chips. One solution to this problem is to replace the tungsten stud or via with aluminum, or some other low resistivity material through which aluminum or copper can diffuse or be transported. The main difficulties with an aluminum stud are finding a technique which can be used to fill high aspect ratio holes with aluminum to form the studs or vias. A number of methods have been investigated, such as chemical vapor deposition (CVD), electron cyclotron resonance (ECR), columnated sputtering, hot sputtering and various electro deposition techniques. With the foregoing methods, however, there are subsequent integration, throughput or thermal budget problems.

Another option is to use copper studs or vias. Filling of extremely high aspect ratio holes, greater than 3, has been recently demonstrated using plating with an (ECR) copper/tantalum liner i.e. B. Luther et al. Proceedings IEEE VLSI Multilevel Interconnections Conference, Santa Clara, Calif. Jun. 8–9, 1993 p.15. The problem with pure copper studs or vias is that aluminum and copper react at about 250° C. to form Al$_2$Cu with a 2.8% volume expansion. A barrier layer placed on top of the studs sufficient to prevent a reaction between the copper stud or via and the aluminum lines or conductors would also decrease the electromigration lifetime, in a similar manner as a tungsten stud or via, by preventing aluminum or copper atoms from being transported through the barrier layer in regions with high current density. Additionally, the thickness of the barrier layers on the aluminum lines or conductors would increase the line height or conductor height and hence the interlevel capacitance between adjacent conductors. If the barrier layer were to fail during subsequent processing, the copper and aluminum would react forming Al$_2$Cu with the associated volume increase of 2.8% which would cause delamination at the metal/oxide or insulator interface.

In U.S. Pat. No. 5,010,039 which issued on Apr. 23, 1991 to S-M Ku et al., describes methods of forming contacts to a semiconductor device where via holes are etched through a deposited first insulation layer on a semiconductor chip with defined contact areas below, then sputtered, evaporated or CVD deposition of an Al/Cu alloy is performed to fill the via holes to make a contact stud. The deposited surface may then be chemical-mechanical polished to planarity.

In U.S. Pat. No. 5,071,714 which issued on Dec. 10, 1991 to K. P. Rodbell et al., a multilayered intermetallic connection for semiconductor devices is described wherein aluminum/copper alloy, less that 2% copper, is deposited on a thin layer of Ti, and another layer of Ti is subsequently deposited on top of the AlCu prior to a final cap layer of Al/Cu or Al. The layers are deposited over semiconductor contact areas and are subsequently annealed to form TiAl$_3$ layers on both the top and bottom AlCu surfaces.

In U.S. Pat. No. 4,884,123 which issued on Nov. 28, 1989 to P. Dixit et al. entitled "Contact Plug and Interconnect Employing a Barrier Lining and a Backfilled Conductor Material", via holes are etched through a first insulator layer on a semiconductor surface over defined contact areas, and then the via interior is flashed with a thin deposit of Ti or TiN, followed by a deposition of Al/Cu, with 1% copper in alloy, to fill and form the contact plug. A second patterned metal layer may be formed contacting the formed Al/Cu contact plugs after planarization.

In U.S. Pat. No. 4,335,506 which issued on Jun. 22, 1982 to G. T. Chiu, a layer of Cu is lift-off deposited onto an Al layer, then the resist is removed and the exposed Al is etched away using the Cu layer as an etch mask. The remaining Al layer with the Cu layer above is annealed to form an Al/Cu alloy metalization and contacts. The step of annealing causes the copper to diffuse into, and alloy with the aluminum layer.

SUMMARY OF THE INVENTION

In accordance with the present invention, an interconnect structure for an integrated circuit for resisting electromigration as high current densities pass through interlayer contact regions of the interconnect structure is described comprising a first patterned interconnect layer having a first metal selected from the group consisting of copper, copper alloys, aluminum and aluminum alloys formed over a first insulation layer and over first electrical contact regions, vias or studs passing through the first insulation layer, a second insulation layer formed over the first patterned interconnect layer and the first insulation layer, the second insulation layer having openings therein with second electrical contact regions, vias or studs therein for making electrical contact with the first patterned interconnect layer, and a second interconnect layer having a second metal selected from the group consisting of copper, copper alloys, aluminum and aluminum alloys formed over the second insulation layer and over the second electrical contact regions, vias or studs, the second electrical contact regions, vias or studs comprising substantially the compound Al$_2$Cu in the theta phase. It is understood that if copper or a copper alloy is used as the interconnect levels then a barrier layer would be required between the Al$_2$Cu stud and the Cu layers. Otherwise the Al$_2$Cu will decompose.

The invention further provides a method for forming interconnections on an integrated circuit chip starting with a dielectric surface with contact regions, vias or studs such as tungsten studs connecting to silicon devices on the chip comprising the steps of: sputter depositing a layer of titanium followed by a layer of Al—Cu where Cu is about 0.5 wt. % of the Al—Cu layer followed by a layer of Ti followed by a layer of TiN to form a first composite metal layer. The composite layer is subsequently patterned into metal lines and annealed at 200° C. for a minimum of 20 minutes (at 360° C.). During this anneal, the Ti reacts with the Al—Cu forming $TiAl_3$ intermetallic compound along both the bottom and top interfaces of the Al—Cu layer. Next, a first insulator layer is formed over and thicker than the first composite metal layer and filling all spaces between metal lines in the pattern of the first composite metal layer to form a generally planarized insulator. A Chemical Mechanical Polish (CMP) can also be used to ensure a planarized insulator. Next, defining and forming contact holes in the first insulator layer down to selected areas on the top of the pattern of metal lines formed from the first composite metal layer. In the contact holes, the top TiN and $TiAl_3$ layers may be removed after forming the contact holes in the first insulator layer. The holes and removal of layers may be accomplished or drilled by reactive ion etching (RIE). Next, the contact holes are filled with Cu such as by chemical vapor deposition (CVD), electrolytic plating, ECR deposition or an electroless Cu processes. Next, a Cu-chemical mechanical polish (CMP) is used to plannarize and to remove any Cu from the dielectric layer. Next, forming Al or Al alloy as a blanket film on top of the first insulation layer and covering all of the Cu filled vias or studs with the blanket film such as by sputtering or evaporation. Alternately, this step may be deleted. Next, annealing the Cu to form $Al_2Cu$ in the vias or studs by reaction with aluminum atoms from the layer above or from the metal lines of the first composite layer below. The annealing temperature typically may be in the range from 200° C. to 400° C. for a time period from 20 to about 60 minutes. Next, the unreacted Al or Al—Cu may be removed from the top surface of the first insulator layer such as by using a wet etch, RIE or CMP. Also, $Al_2Cu$ extending above the contact holes may be removed by CMP. The foregoing steps may be repeated to form additional levels of interconnection.

The invention further provides metal vias or studs of $Al_2Cu$ in the theta phase which has a resistivity of 8 micro-Ohm-cm which is less than the resistivity of tungsten studs or vias which have a resistivity in the range from 10 to 13 micro-Ohm-cm.

The invention further provides metal vias or studs of $Al_2Cu$ in the theta phase between patterned metallic layers which serve as a source and path for Cu to move to both the upper and lower Al—Cu lines to reduce the susceptibility to electromigration and thermal voiding as compared to tungsten.

The invention further provides metal vias or studs of $Al_2CU$ in the theta phase which may be uncovered during subsequent etching since $Al_2Cu$ is an excellent etch stop.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENT

Figure 1:
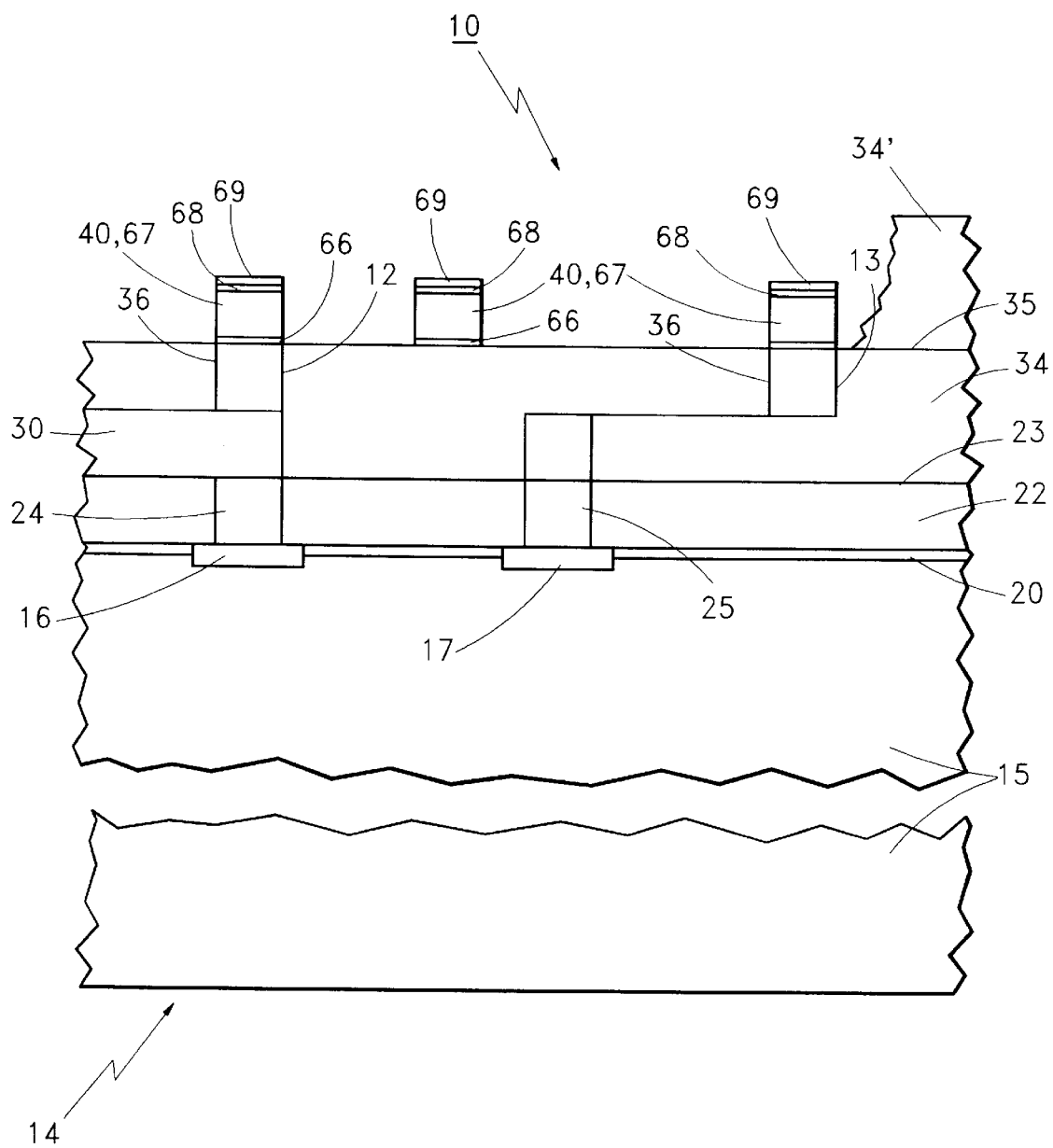
FIG. 1 is one embodiment of the invention.

Referring now to the drawing, FIG. 1 shows interconnect structure 10 above semiconductor chip 14.

Referring to FIG. 1, interconnect structure 10 is shown for resisting electromigration as high current densities pass through interlayer contact regions or studs 12 and 13. Interlayer contact region or studs 12 and 13 comprises substantially the compound $Al_2Cu$ in the theta phase. Interlayer contact regions 12 and 13 may thus allow the transport of copper atoms and aluminum atoms due to very high current densities to and from adjacent wiring layers. As shown in FIG. 1, a semiconductor chip may have a substrate 15 with p and n impurity regions formed therein and in ohmic contact with contact regions 16 and 17 which may be, for example, titanium silicide for interconnecting to p and n regions. A layer of insulation 20 may be formed over substrate 15 and may be silicon dioxide or silicon nitride. Substrate 15 may be a semiconductor such as silicon, silicon germanium alloy, or germanium or some other semiconductor material. An insulation layer 22, for example, silicon dioxide may be formed over insulation layer 20 and contact regions 16 and 17. Openings may be formed in insulation layer 22 and subsequently filled with a metalization to make ohmic contact with contact regions 16 and 17. The metalization may be tungsten which provides a barrier to copper atoms. As shown in FIG. 1 contact regions 16 and 17 are connected to electrical contact regions or studs 24 and 25. Insulation layer 22 may have an upper surface 23 which is also co-planar with the upper surface of electrical contact regions 24 and 25. The upper surface 23 of insulation layer 22 may be formed by chemical-mechanical polish (CMP) and may be substantially planar.

The integrated circuit chip 14 may now be connected by way of an interconnect structure 10 formed above upper surface 23. Wherein upper surface 23 has a plurality of contact regions such as 24 and 25.

A first patterned interconnect layer 30 may be formed on upper surface 23 such as by a blanket deposition of a metal selected from the group consisting of copper, copper alloys, aluminum and aluminum alloys. The blanket layer may be photolithographically patterned by way of photoresist and etching to form the first patterned interconnect layer 30. In the case of copper, damascene patterns would be used. The thickness of the metal lines or height may be determined by the thickness of the blanket layer of metal and may be in the range from 100 nm to 1500 nm. An insulation layer 34 may be formed over first patterned interconnect layer 30 and over upper surface 23 having a thickness to cover first patterned interconnect layer 30 and may be in the range from layer 30 thickness to 3000 nm. Insulation layer 34 is typically planarized and may have a greater thickness than the thickness of first patterned interconnect layer 30. Insulation layer 34 may be, for example, silicon dioxide, silicon nitride, polyimide and diamond-like carbon. Insulation layer 34 may have openings 36 formed therein to expose portions of first patterned interconnect layer 30 wherein interconnections are desired. Openings 36 may be formed by reactive ion etching (RIE). The openings are subsequently filled with copper which is planarized and annealed at a temperature to allow aluminum atoms to react with the copper to form $Al_2Cu$ in the theta phase in regions or studs 12 and 13. The copper may require a thin adhesion layer which would be from the group of refractory metals Ti, Ta, TiN, etc. A sacrificial layer of Al or Al alloy would be deposited on top of the Cu to serve as a source of Al to form $Al_2Cu$. This can then be removed prior to the deposition of layer 40.

The second patterned interconnect layer 40 is formed over upper surface 35 of insulation layer 34 and over interlayer contact regions or studs 12 or 13. The second patterned interconnect layer 40 may be formed by first forming a blanket deposit of metal selected from the group consisting of copper, copper alloys, aluminum and aluminum alloys. A photoresist layer may be formed over the blanket layer of metal, exposed and developed. The blanket layer may be etched using the photoresist as a mask. The photo resist may be subsequently removed. The height or thickness of the second pattern interconnect layer 40 may be determined by the thickness of the blanket layer of metal deposited prior to patterning and may be in the range from 100 to 1500 nm.

While FIG. 1 shows first patterned interconnect layer 30 and second pattern interconnect layer 40, additional patterned interconnect layers may be added by repeating the structure shown between first patterned interconnect layer 30 and second patterned interconnect layer 40.

FIGS. 2 through 6 shows steps in forming the embodiment of FIG. 1. In FIGS. 2 through 6 like references are used for functions corresponding to the apparatus of FIG. 1. Electrical contact region 24 may be tungsten which provides a barrier to the diffusion of Al and copper atoms towards substrate 15 shown in FIG. 1. First patterned interconnect layer 30 may be formed by sputter depositing a blanket layer of titanium 46 followed by a layer of aluminum-copper 47 followed by a layer of titanium 48 followed by a layer of titanium nitride TiN 49. Layer 49 of titanium nitride provides an anti-reflection coating useful for preventing reflection of light when first patterned interconnect layer 30 is patterned. Layers 46 through 49 comprising first patterned interconnect layer 30 after patterning are annealed at 400° centigrade for a minimum of 20 minutes. During this step of annealing, the titanium layers 46 and 48 react with the aluminum in layer 47 forming $TiAl_3$ in a metallic compound along both the bottom and top interfaces of layer 47. Layers 46 and 48 initially of titanium are reacted to form $TiAl_3$.

Next, an insulation layer 34 such as silicon dioxide is applied over first patterned interconnect layer 30 such as by a PECVD (Plasma enhanced Chemical Vapor Deposited) oxide 34 and over first patterned interconnect layer 30 which results in a planarized insulator having high aspect features filled with oxide in the first patterned interconnect layer 30. Planarization of insulation layer 34 may be achieved by RIE or by CMP.

Figure 2:
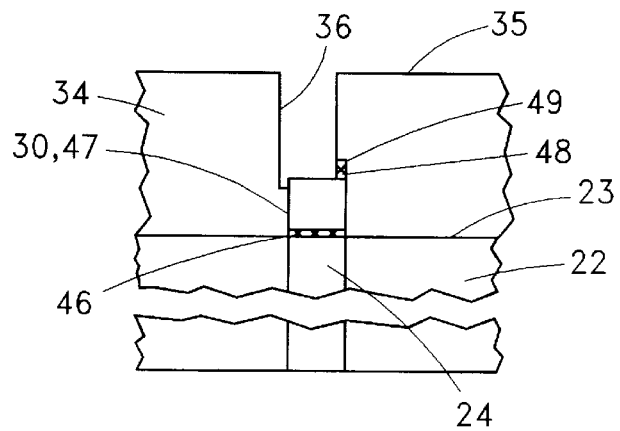
FIGS. 2 through 6 show steps in forming the embodiment of FIG. 1.

Next, openings 36 are drilled or formed in insulation layer 34 down to the top of first patterned interconnect layer 30. Openings 36 and subsequent studs 12 and 13 may be in the range from 100 to 2000 nm in height. In forming openings 36, the alignment of the openings to the first patterned interconnect layer 30 may not be perfect as shown in FIG. 2. Further, layer 49 and 48 may be removed during the drilling or forming of opening 36 which may be formed by RIE.

Figure 3:
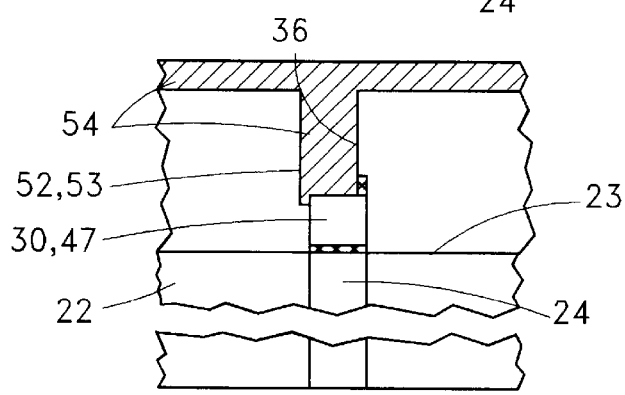

Next, as shown in FIG. 3, opening 36 including the walls and bottom of opening 36 have a thin adhesion layer 52 of a refractory metal such as tantalum formed thereon for adhesion. Next a copper seed layer 53 can be formed over adhesion layer 52 such as by sputtering. Opening 36 may be completely filled by electroless or electrolytic plating copper using copper seed layer 53 as an electrode during the electrolytic plating process. Alternately, in place of copper seed layer 53, opening 36 may be filled with copper completely by bias sputtering, hot evaporation, CVD, etc. . . .

Figure 4:
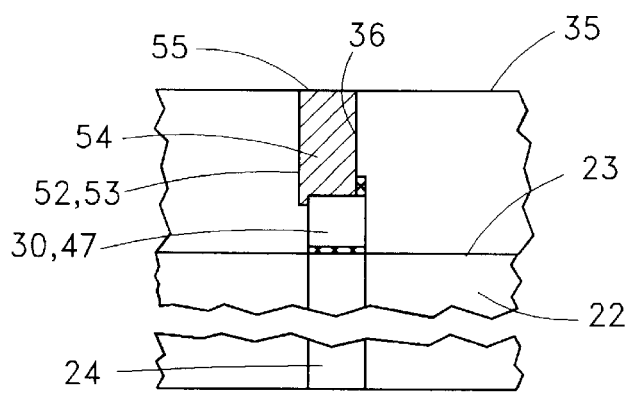

Next, as shown in FIG. 4, adhesion layer 52, copper seed 53 and copper 54 is removed from upper surface 35 such as by chemical mechanical polish.

Figure 5:
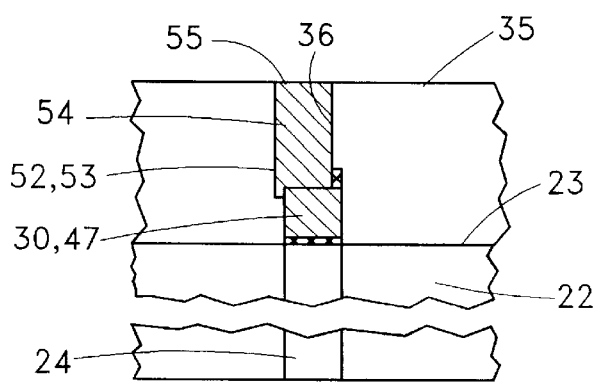

Next, as shown in FIG. 5, copper 54 in opening 36 may be annealed at a temperature in the range from 200° centigrade to 548° centigrade to form $Al_2Cu$ in the theta phase.

The aluminum atoms are supplied by diffusing from layer 47 through the adhesion layer 52, copper seed layer 53 and copper layer 54. Since $Al_2Cu$ has a 2.8 percent volume expansion with respect to Cu alone, the material in opening 46 will extrude upwards and form a mushroom above upper surface 35 which may be subsequently removed by a brief chemical-mechanical polish.

Figure 6:
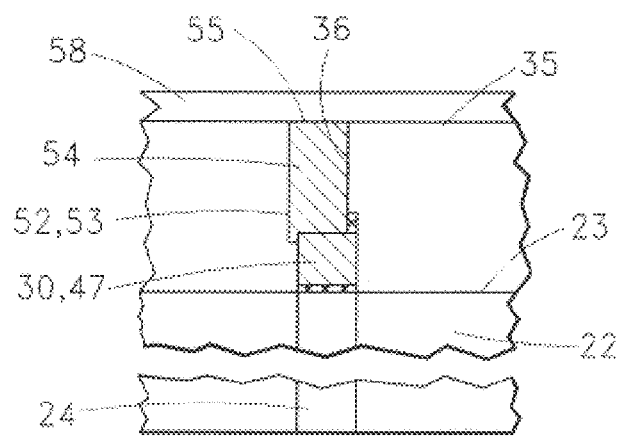

In an alternate method, prior to annealing copper 54, a blanket layer 58 may be formed on upper surface 35 and on the upper surface 55 of copper 54 shown in FIG. 6. Blanket layer 58 may be formed by sputtering or by evaporation. The material in opening 36 namely copper 54 may be converted to $Al_2Cu$ in the theta phase by annealing in the range from 200° C. to 548° C. for 60 minutes (at 400° C.). Blanket layer 58 as well as layer 47 will provide aluminum atoms by way of diffusion into copper 54 thereby enabling $Al_2Cu$ to be formed in place of copper 54 and copper seed layer 53, if present. At the same time copper atoms from copper 54 will diffuse into blanket layer 58 and layer 47. Next, the unreacted Al—Cu or Al on upper surface 35 and above opening 36 is removed using a wet etch, RIE or chemical-mechanical polish or combinations thereof. This method would be required if layer 47 was copper.

The resulting structure from the process steps shown in FIGS. 2–6 is interlevel contact regions or studs 12 and 13 shown in FIG. 1 which comprise $Al_2Cu$. Interlayer contact regions or studs 12 and 13 comprised of $Al_2Cu$ are in the theta phase and would have a resistivity of 8 micro-Ohm-cm which is less than that of tungsten vias which would have a resistivity in the range from 10 to 13 micro-Ohm-cm. Since the $Al_2Cu$ studs are formed reactively they also have a lower contact resistance than the W studs.

Next, as shown in FIG. 1, a second patterned interconnect layer 40 may be formed comprising first depositing a thin titanium layer 66 for adhesion, depositing an aluminum-copper layer 67, depositing thereover a titanium layer 68 followed by a titanium nitride layer 69 which functions as an anti-reflection coating. The blanket layers 66 through 69 may be patterned by applying and developing photoresist to form a mask and etching through the mask.

Layers 66 through 69 may be formed by the same processes and to the same thicknesses as layers 46 through 49. Additional levels of metallization may be added by repeating the steps described herein starting with the step of forming an insulation layer 34 (which may be the same as layer 34 described previously) over second patterned interconnect layer 40.

Figure 7:
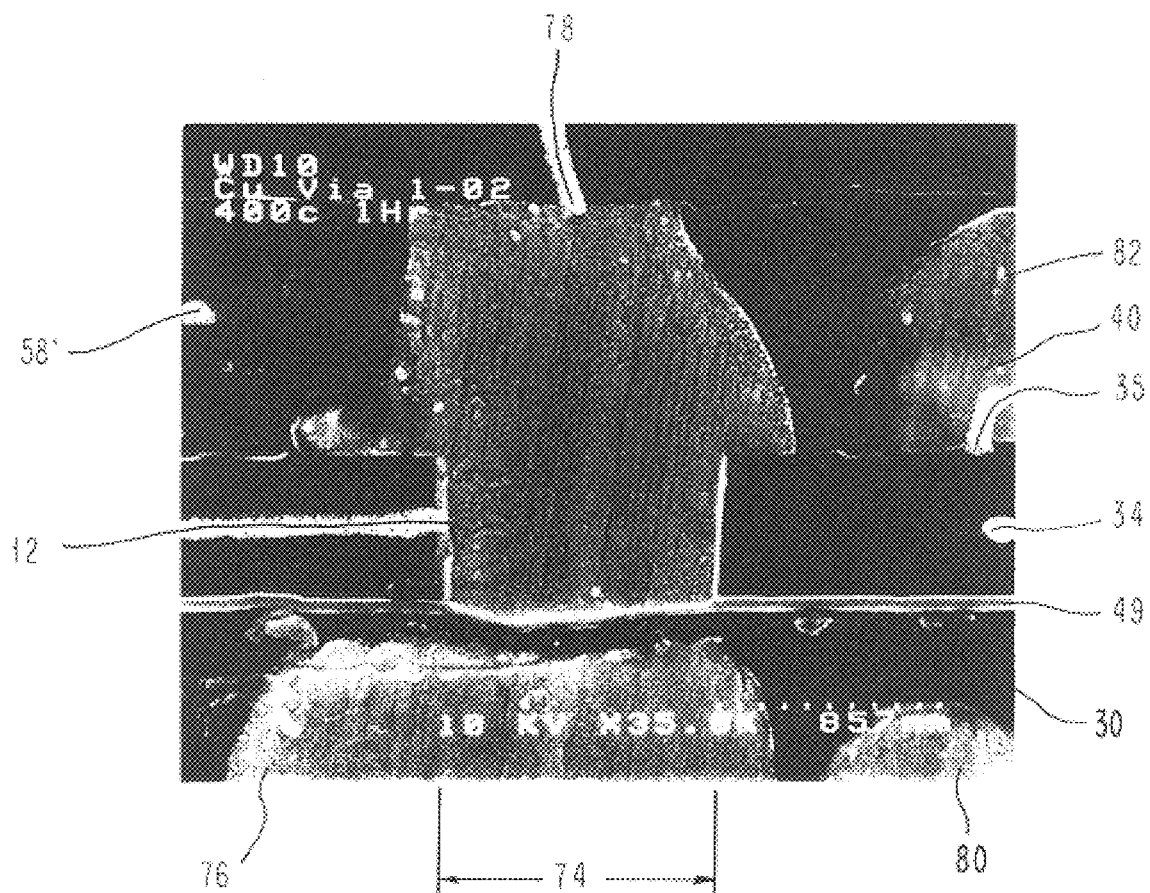
FIG. 7 shows a cross-section view of an interconnect structure fabricated in the laboratory.

FIG. 7 shows a cross section view of an interconnect structure fabricated in the laboratory taken with a scanning electron microscope (SEM). In FIG. 7 like references are used for functions corresponding to the apparatus of FIGS. 1 through 6. The width or diameter of interlayer contact region 12 is about one micron wide as shown by arrow 74. The cross section view was taken after forming $Al_2Cu$ (12) by annealling Cu in contact with an Al line (47) and blanket Al film 58. First patterned interconnect layer 30 shows a TiN layer 49 on either side of interlayer contact region 12 on the top surface of layer 30. FIG. 7 shows interlayer contact region 12 of $Al_2Cu$ and that some Cu diffused into layers 30 and 40 to form $Al_2Cu$ precipitates 76 and 78 below and above region 12. A second precipitate 80 and 82 in layers 30 and 40 to the right of region 12 were formed with respect to another contact region of $Al_2Cu$ out of view to the right of contact region 12. Layer 30 was comprised of Al—Cu where Cu was 0.5% weight. Insulation layer 34 was silicon dioxide. FIG. 7 shows the $Al_2Cu$ formation prior to removal of the top sacrificial Al (or AlCu) layer. Additionally there appears to be some damage to the lower interface during SEM sample preparation.

It was disclosed by Q. Z. Hong and F. M. d'Heurle, at the Materials Research Symposium 1992 Fall Meeting, that Cu is a dominant diffusing species in $Al_2Cu$ formation and that the reaction is a function of temperature. At 200° centigrade the ratio of Cu/Al moving species is 3 to 1 whereas at 400° centigrade the ratio of Cu/Al moving species is closer to 1 to 1. Therefore, it is possible to choose an annealing temperature which balances the mass flux to avoid void formation yet allows for the reaction in opening 36 to proceed to completion. Further, it is noted that the theta-phase-studs 12 and 13 will be in equilibrium with layers 47 and 67 of Al—Cu where Cu may be 2 percent weight and therefore may dissolve with additional annealing cycles to satisfy the Al layers 47 and 67 solubility. This has been beneficial since the theta-phase-studs 12 and 13 will then serve as a Cu source for the Al—Cu layers 47 and 67. Layers 47 and 67 would thus be less susceptible to electromigration and less sensitive to thermal voiding than, for example, if the studs 12, 13 were tungsten which provides a barrier to copper and Al. The lower susceptibility is due to Cu and Al being able to diffuse through $Al_2Cu$ whereas W is impermeable to Cu and Al at normal operating and processing temperatures.

Additionally, during processing, interlayer contact regions 12 and 13 of $Al_2Cu$ may be uncovered since $Al_2Cu$ is difficult to etch (wet etch or RIE). Thus, the presence of $Al_2Cu$ studs 12 and 13 would be very advantageous during the Al—Cu RIE of the second patterned interconnect layer 40 since studs 12 and 13 may be exposed or uncovered. $Al_2Cu$ is also much more difficult to etch (wet etch or RIE) than Al so stud removal during the etching of second patterned interconnect layer 40 or during over-etch would be greatly reduced.

Figure 8:
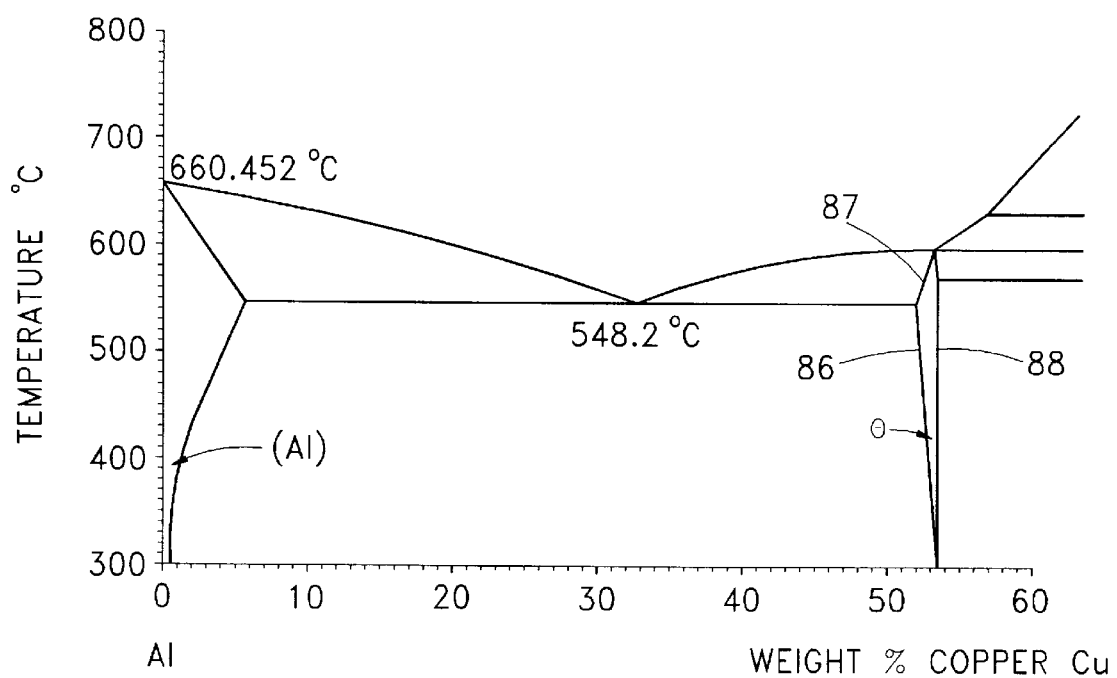
FIG. 8 is a binary phase diagram for Al—Cu.

FIG. 8 is a binary phase diagram for Al—Cu showing that $Al_2CU$ in the theta phase forms when Cu is annealed in an Al rich environment. In FIG. 8, the theta phase is shown to be bounded by lines 86–88 and to occur in the range from 53 to 54% weight Cu. $Al_2Cu$ in the theta phase is stable up to 590° C. At the eutectic temperature of 548.2° C., the composition range is in the range from 31.9 to 32.9 atomic percent Cu. For further information about $Al_2Cu$ in the theta phase, reference is made to T. B. Massalski, *Binary Alloy Phase Diagrams*, published by American Society For Metals, Metals Park, Ohio 44073 (1986) pages 106 and 107 which are incorporated herein by reference.

While there has been described and illustrated an interconnect structure formed on an integrated circuit chip for resisting electromigration by providing interlayer contact regions of $Al_2Cu$ in the theta phase between patterned interconnect layers of Al—Cu or Al, it would be apparent to those skilled in the art that modifications and variations are possible without deviating from the broad scope of the invention which shall be limited solely by the scope of the claims appended hereto.

Having thus described our invention, what we claim as new and desire to secure by letters patent is:

1. An interconnect structure for an integrated circuit chip for resisting electromigration as high current densities pass through interlayer contact regions of said interconnect structure comprising:

a first patterned interconnect layer including a first metal selected from the group consisting of copper, copper alloys, aluminum, and aluminum alloys, a first insulation layer over said first patterned interconnect layer, said first insulation layer having first electrical contact regions passing through said first insulation layer for making electrical contact with said first patterned interconnect layer, and a second patterned interconnect layer including a second metal selected from the group consisting of copper, copper alloys, aluminum and aluminum alloys over said first insulation layer and over said first electrical contact regions, said first electrical contact regions comprising contiguous grains of the compound $Al_2Cu$ in the theta phase throughout each of said first electrical contact regions thus allowing the transport of copper atoms and aluminum atoms due to very high current densities to and from said first and second patterned interconnect layers.

2. An interconnect structure of claim 1 wherein said first patterned interconnect layer further includes a lower layer of $TiAl_3$.

3. The interconnect structure of claim 1 wherein said first patterned interconnect layer further includes a top layer of $TiAl_3$.

4. The interconnect structure of claim 1 wherein said first insulation layer includes a dielectric selected from the group consisting of silicon dioxide, silicon nitride, polyimide, and diamond like carbon.

5. The interconnect structure of claim 1 wherein said second patterned interconnect layer further includes a bottom layer of $TiAl_3$.

6. The interconnect structure of claim 1 wherein said first electrical contact regions comprise substantially contiguous grains of the compound $Al_2Cu$ in the theta phase formed by annealing Cu in the range from 200° C. to 548° C.

7. The interconnect structure of claim 1 further including a second insulation layer over said second patterned interconnect layer and said first insulation layer, said second insulation layer having second electrical contact regions therein for making electrical contact with said second patterned interconnect layer.

8. The interconnect structure of claim 1 wherein said first patterned interconnect layer is selected from the group consisting of copper and copper alloys and further including a barrier layer to Cu atoms positioned between said first patterned interconnect layer and said first electrical contact regions to prevent said $Al_2Cu$ from decomposing.

9. The interconnect structure of claim 7 further including a third patterned interconnect layer including a third metal selected from the group consisting of copper, copper alloys, aluminum and aluminum alloys over said second insulation layer and over said second electrical contact regions, said second electrical contact regions comprising contiguous grains of the compound $Al_2Cu$ in the theta phase throughout each of said second electrical contact regions thus allowing the transport of copper atoms and aluminum atoms due to very high current densities to and from said second and third patterned interconnect layers.

10. The interconnect structure of claim 9 wherein said third electrical contact regions comprise substantially contiguous grains of the compound $Al_2Cu$ in the theta phase formed by annealing Cu in the range from 200° C. to 548° C.

* * * * *